United States Patent
Torregrosa et al.

(10) Patent No.: US 9,520,274 B2
(45) Date of Patent: Dec. 13, 2016

(54) ION IMPLANTER PROVIDED WITH A PLURALITY OF PLASMA SOURCE BODIES

(71) Applicant: ION BEAM SERVICES, Peynier (FR)

(72) Inventors: Frank Torregrosa, Simiane (FR); Laurent Roux, Marseilles (FR)

(73) Assignee: ION BEAM SERVICES, Peynier (FR)

( * ) Notice: Subject to any disclaimer, the term of this patent is extended or adjusted under 35 U.S.C. 154(b) by 0 days.

(21) Appl. No.: 14/647,193

(22) PCT Filed: Nov. 25, 2013

(86) PCT No.: PCT/FR2013/000308
§ 371 (c)(1),
(2) Date: May 26, 2015

(87) PCT Pub. No.: WO2014/083246
PCT Pub. Date: Jun. 5, 2014

(65) Prior Publication Data
US 2015/0325412 A1    Nov. 12, 2015

(30) Foreign Application Priority Data
Nov. 27, 2012   (FR) ...................... 12 03188

(51) Int. Cl.
*H01J 37/36*    (2006.01)
*H01J 37/32*    (2006.01)

(52) U.S. Cl.
CPC .... *H01J 37/32357* (2013.01); *H01J 37/32412* (2013.01); *H01J 2237/31701* (2013.01); *H01J 2237/3365* (2013.01)

(58) Field of Classification Search
USPC ................... 250/396 R, 423 R, 491.1, 492.1, 492.2, 250/492.21, 492.22, 492.3
See application file for complete search history.

(56) References Cited

U.S. PATENT DOCUMENTS 6,274,459 B1    8/2001  Chan
6,300,227 B1 *  10/2001 Liu ......................... C23C 14/48
                                                         118/723 IR

FOREIGN PATENT DOCUMENTS

EP    0 480 688 A2    4/1992
WO    01/15200 A1     3/2001

OTHER PUBLICATIONS

International Search Report for PCT/FR2013/000308 dated Mar. 19, 2014.
French Search Report for FR 1203188 dated Jul. 26, 2013.

* cited by examiner

*Primary Examiner* — Nicole Ippolito
(74) *Attorney, Agent, or Firm* — Sughrue Mion, PLLC

(57) ABSTRACT

The invention relates to an ion implanter that comprises an enclosure ENV having arranged therein a substrate carrier PPS connected to a substrate power supply ALT via a high voltage electrical passage PET, the enclosure ENV being provided with pump means PP, PS, the enclosure ENV also having at least two cylindrical source bodies CS1, CS2 free from any obstacle and arranged facing the substrate carrier. This implanter is remarkable in that it includes at least one confinement coil BCI1-BCS1, BCI2-BCS2 per source body CS1, CS2.

7 Claims, 4 Drawing Sheets

ION IMPLANTER PROVIDED WITH A PLURALITY OF PLASMA SOURCE BODIES

CROSS REFERENCE TO RELATED APPLICATIONS

This application is a National Stage of International Application No. PCT/FR2013/000308 filed Nov. 25, 2013, claiming priority based on French Patent Application No. 1203188 filed Nov. 27, 2012, the contents of all of which are incorporated herein by reference in their entirety.

BACKGROUND OF THE INVENTION

The present invention relates to an ion implanter provided with a plurality of plasma source bodies.

The field of the invention is that of ion implanters operating in plasma immersion mode. Thus, implanting ions in a substrate consists in immersing the substrate in a plasma and in biasing it with a negative voltage of a few tens of volts to a few tens of kilovolts (kV) (generally at least 100 kV), in order to create an electric field that is capable of accelerating the ions of the plasma towards the substrate.

The penetration depth of the ions is determined by their acceleration energy. It depends firstly on the voltage applied to the substrate and secondly on the respective natures of the ions and of the substrate. The concentration of implanted atoms depends on the dose, which dose is expressed as a number of ions per square centimeter ($cm^2$), and also on the implantation depth.

The plasma is generated within a source body that is arranged facing the substrate carrier. The source body is in the form of a cylindrical segment that is free from any inside obstacle; it opens out into the enclosure of the implanter. Around each source body, there is a radiofrequency antenna that is provided to generate the plasma. In general, the cylinder constituting the source body is a circular cylinder.

The diameter of the source body is necessarily limited since plasma density decreases with increasing distance from the antenna. In order to conserve a satisfactory plasma density at the center of the source body, this diameter thus generally lies in the range 100 millimeters (mm) to 200 mm.

The plasma extends from the source body towards the substrate carrier with a hyperboloid profile. As a result, a substrate of large size needs to be placed relatively far from the substrate carrier if it is desired for implantation to take place over its entire area.

This spacing has the consequence of significantly reducing the density of the plasma at the level of the substrate. As a result, for a given dose, the time required for implantation is considerably increased.

Thus, Document EP 0 480 688 teaches an arrangement of plasma sources for ion implantation. The implanter has an enclosure in which a substrate carrier is arranged that is connected to a substrate power supply via a high voltage electrical passage, the enclosure being provided with pump means, the enclosure also including a cylindrical source body free from any obstacle and arranged facing the substrate carrier, the enclosure including at least one additional cylindrical source body that is also free from any obstacle and that is also arranged facing the substrate carrier.

Mention may also be made of Document U.S. Pat. No. 6,300,227, which describes an ion implantation system operating by plasma immersion analogous to that described above.

In both of those documents, magnetic confinement means are provided for the enclosure. Unfortunately, such an arrangement is not good for plasma uniformity.

SUMMARY OF THE INVENTION

An object of the present invention is thus to provide an ion implanter that is suitable for substrates of large dimensions, also making it possible to treat a large number of substrates of small dimensions arranged on a substrate carrier of large size, with the implanter providing increased plasma uniformity.

According to the invention, an ion implanter comprises an enclosure having arranged therein a substrate carrier connected to a substrate power supply via a high voltage electrical passage, the enclosure being provided with pump means, the enclosure also having at least two cylindrical source bodies free from any obstacle and arranged facing the substrate carrier; the ion implanter is remarkable in that it includes at least one confinement coil per source body.

With this configuration, the magnetic field is at a maximum where the plasma forms. The field lines flare inside the enclosure, thereby causing the plasma to be extended, with the consequence of achieving good uniformity over a larger area at the level of the substrate carrier. Furthermore, it is thus possible to adjust the magnetic field produced by each confinement coil, thereby providing an additional adjustment for improving the uniformity over the surface that is to be treated.

Advantageously, each of said source bodies is provided with an external radiofrequency antenna.

According to an additional characteristic of the invention, the ion implanter includes a common radiofrequency generator for all of the antennas.

In a first embodiment, the ion implanter includes a single tuning box arranged between the radiofrequency generator and the antennas.

In a second embodiment, the ion implanter includes, downstream from the radiofrequency generator, a tuning box followed by a separator.

In a third embodiment, the ion implanter includes, downstream from the radiofrequency generator, a separator followed by a number of tuning boxes identical to the number of source bodies.

BRIEF DESCRIPTION OF THE DRAWINGS

The present invention appears below in greater detail in the following description of embodiments given by way of illustration and with reference to the accompanying drawings, in which.

Elements that are present in more than one of the figures are given the same references in each of them.

DETAILED DESCRIPTION OF THE INVENTION

Figure 1:
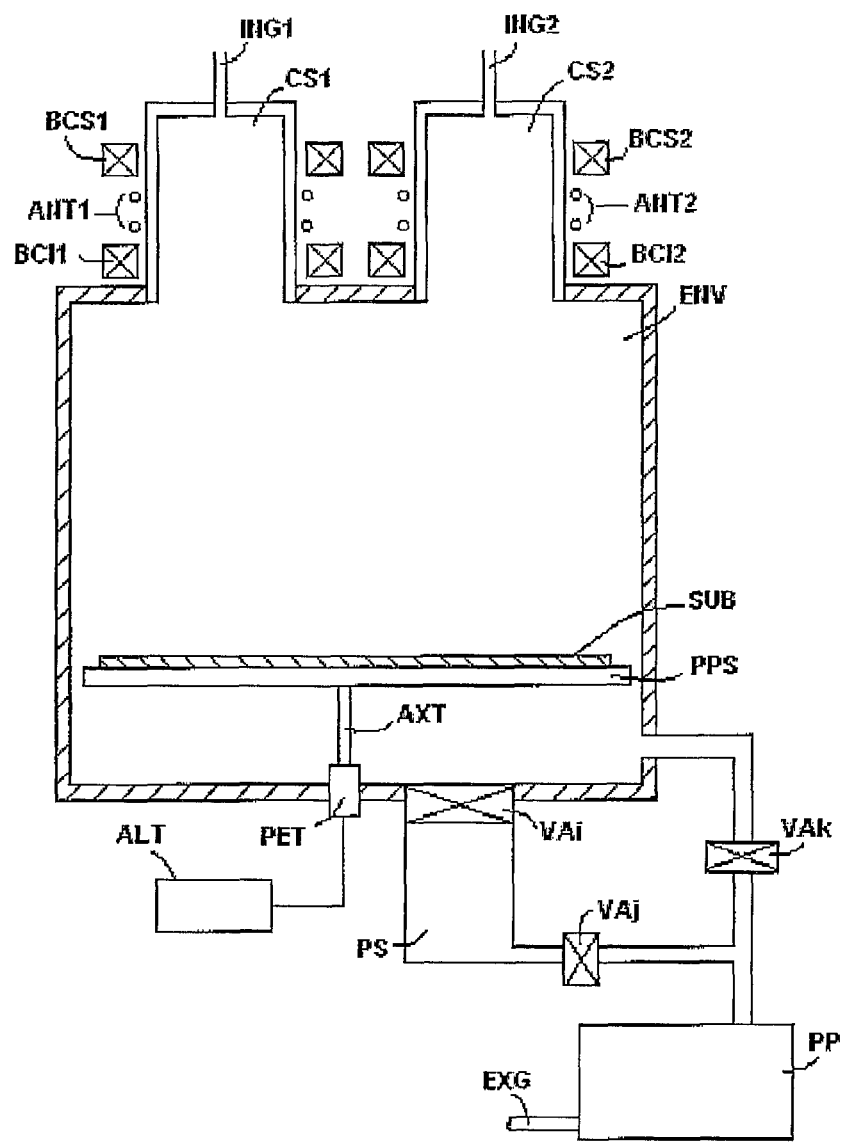
FIG. 1 is a diagrammatic vertical segment of an ion implanter of the invention.

As shown in FIG. 1, an ion implanter comprises a plurality of elements arranged inside and outside a vacuum enclosure ENV. For microelectronic applications, it is recommended to use an enclosure made of aluminum alloy (or indeed an enclosure made of stainless steel protected by plates of aluminum alloy) if it is desired to limit contamination from metallic elements such as iron, chromium, nickel, or cobalt. It is also possible to use a coating made of silicon or of silicon carbide.

A substrate carrier platen PPS, in the form of a disk in a horizontal plane, possibly mounted to turn about its vertical axis AXT, receives the substrate SUB that is to be subjected to ion implantation.

A high voltage electrical passage PET formed in the bottom portion of the enclosure ENV serves to connect the vertical shaft AXT of the platen, and thus the substrate carrier platen PPS, electrically to a substrate power supply ALT.

Figure 3:
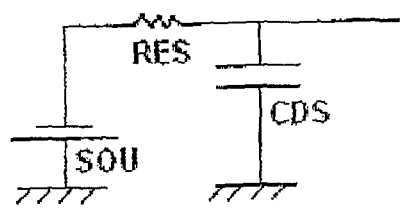
FIG. 3 shows a first embodiment of the substrate power supply.

With reference to FIG. 3, in a first embodiment, this substrate power supply ALT comprises a direct current (DC) voltage generator SOU having its positive pole connected to ground. A branch connection in parallel with the generator is formed by a capacitor CDS and a resistor RES in series, this resistor being connected to the negative pole of the generator SOU. The substrate carrier platen PPS is connected to the common point between the capacitor CDS and the resistor RES.

The capacitor CDS has capacitance of low value in order to cause the potential of the substrate to return progressively to a value close to zero while it is discharging.

Figure 4:
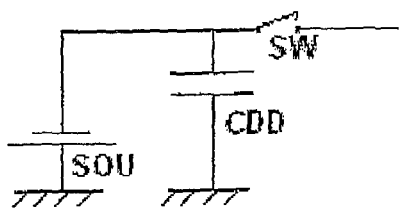
FIG. 4 show a second embodiment of the substrate power supply.

With reference to FIG. 4, in a second embodiment, this substrate power supply ALT comprises a DC voltage generator SOU having its positive pole connected to ground. A capacitor CDD is connected in parallel with the generator. A switch SW is connected between the negative pole of the generator SOU and the substrate carrier platen PPS. This switch SW is made of metal oxide semiconductor (MOS) technology or of insulated gate bipolar transistor (IGBT) technology.

Figure 5:
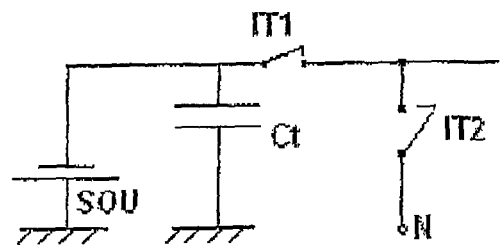
FIG. 5 shows a third embodiment of the substrate power supply.

With reference to FIG. 5, in a third embodiment analogous to that described in Document WO 01/15200, the substrate power supply ALT comprises:

- a DC voltage generator SOU having its positive pole connected to ground;
- a capacitor Ct in parallel with the generator GEN;
- a first switch IT1 having its first pole connected to the negative pole of the generator SOU and having its second pole connected to the output of the power supply; and
- a second switch IT2 having its first pole likewise connected to the output and having its second pole connected to a neutralizing terminal; this neutralizing terminal is connected either to ground, or to a low positive voltage (at a few tens of volts) via a discharge resistor).

Furthermore, pump means are also arranged at the bottom portion of the enclosure ENV. A primary pump PP has its inlet connected to the enclosure ENV via a pipe having a valve VAk, and an outlet connected to the open air via an exhaust pipe EXG. A secondary pump PS has its inlet connected to the enclosure ENV via a pipe provided with a valve VAi, and its outlet connected to the inlet of the primary pump PP via a pipe having a valve VAj. The pipes are not referenced.

In this example, the ion implanter has four identical source bodies, only two of which can be seen in FIG. 1. A source body is in the form of a segment of a cylinder having its base opening out into the enclosure ENV and having its top closed by a plate. These source bodies do not contain any obstacles so that a plasma can propagate through them freely.

Figure 2:
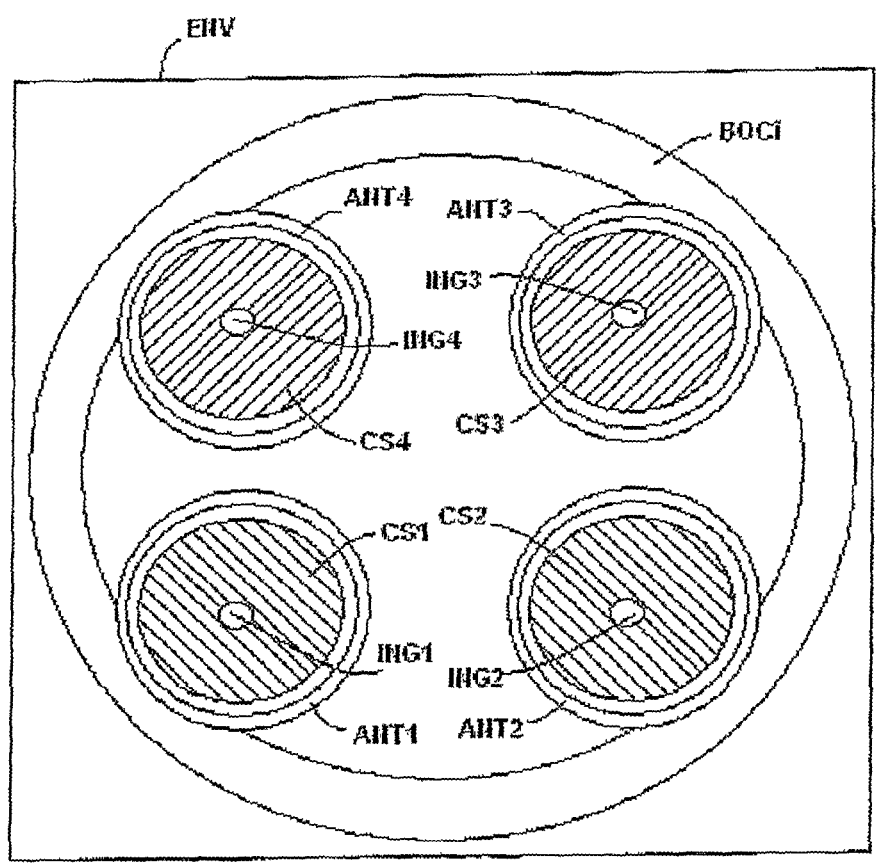
FIG. 2 is a diagrammatic plan view of the implanter.

With reference to FIGS. 1 and 2, the top portion of the enclosure ENV thus receives four source bodies CS1, CS2, CS3, and CS4 that face the substrate carrier PPS. These bodies are made of quartz. Externally each of them is surrounded by a radiofrequency antenna ANT1, ANT2, ANT3, or ANT4 that is situated substantially in its middle. Each of them is provided with an inlet ING1, ING2, ING3, or ING4 for a plasma-generating gas, which inlet is centered on the plate at its top.

Advantageously, the four source bodies CS1, CS2, CS3, and CS4 are also surrounded by respective bottom magnetic confinement coils situated between the antennas ANT1, ANT2, ANT3, or ANT4 and the enclosure ENV. It is preferred to use one coil per source body. Thus, in FIG. 1, there can be seen a first confinement coil BCl1 for the first source body CS1 and a second confinement coil BCl2 for the second source body CS2.

The four source bodies CS1, CS2, CS3, and CS4 are preferably also surrounded by respective top magnetic confinement coils BOCs, which are omitted from FIG. 2 for reasons of clarity. Each of these top confinement coils is situated between one of the antennas ANT1, ANT2, ANT3, or ANT4 and the top of the corresponding source body. In like manner, there is a first coil BCS1 for the first source body CS1, and a second source body CS2.

It is possible to use any type of pulse plasma source: discharge, inductively coupled plasma (ICP), helicon, microwaves, arc. These sources need to work at pressure levels that are low enough to ensure that the magnetic field created between the platen PPS at high voltage and the enclosure ENV at ground voltage does not ignite a discharge plasma that would disturb the pulse operation of the source.

The source should be selected so as to make it possible to have a plasma potential of less than 20 volts (V). The ion acceleration energy is the difference between the plasma potential and the potential of the substrate. The acceleration energy is thus controlled solely by the voltage applied to the substrate. This point becomes predominant if it is desired to have acceleration energies that are very low, less than 500 electron volts (eV), as applies to microelectronic applications.

For applications requiring a low level of metallic contamination, again such as microelectronics, and also the treatment of parts in the medical field, the source must not present a contaminating metallic element in contact with the plasma. In the embodiment shown, a radiofrequency source RF formed by a tube of quartz is associated with an external radiofrequency antenna ANT and with magnetic confinement coils BOCi and BOCs, as described above. Alternatively, the source body may be made of alumina.

Any plasma-generating species may be used. It is possible to start from a gaseous precursor such as $N_2$, $O_2$, $H_2$, He, Ar, $BF_3$, $B_2H_6$, $AsH_3$, $PH_3$, $SiH_4$, or $C_2H_4$; it is also possible to use a mixture of gases such as $B_2H_6+H_2$, $AsH_3+H_2$, $PH_3+H_2$, etc. It is also possible to start from a liquid precursor such as $TiCl_4$, $H_2O$, or indeed a solid precursor. With a solid precursor, it is appropriate to use a thermal evaporation system (phosphorus) or a hollow cathode system.

In the first embodiment of the substrate power supply described with reference to FIG. 3, the implantation method using the implanter comprises repeating the following four or five stages periodically:
  a stage of charging the capacitor CDS (the plasma source being off) from the generator SOU until a discharge voltage is obtained;
  a stage of igniting the plasma that is initiated when the voltage of the substrate reaches the discharge voltage; since the impedance of the plasma is no longer infinite, the capacitor CDS discharges through the capacitor;
  a stage of discharging the capacitor CDS, during which implantation is performed and during which the plasma sheath extends; and
  a stage of extinguishing the plasma that is initiated when the preceding stage has lasted for a desired duration: the impedance of the plasma is once more infinite and the charging stage can be reiterated; and
  an optional waiting stage, during which nothing happens, thus making it possible to adjust the repetition period.

During the discharge stage, which lasts for the duration of one plasma pulse, a plasma extension zone constituted by a cloud of ionized gas forms between the source bodies CS1, CS2, CS3, and CS4 and the substrate carrier platen PPS. The particles strike the substrate SUB for implanting with energy that enables them to penetrate into the inside of the substrate SUB.

In the second embodiment of the substrate power supply described with reference to FIG. 4, the method of implantation using the implanter takes place as follows.

While the switch SW is open, the capacitor CDD charges progressively to the nominal voltage of the generator SOU.

When the switch SW is closed, the plasma is ignited, and current is taken as a result of the equivalent capacitance of the machine and as a result of the capacitance of the plasma sheath. The equivalent capacitance of the machine is the capacitance of the all of the elements making it up, in particular the cables, electrical passages, isolating transformers, and the capacitance between the substrate carrier and the enclosure.

The switch SW remains closed typically for a period lying in the range 5 microseconds (µs) to 100 µs, during which stage implantation takes place, since positive ions are attracted towards the substrate which is negatively biased.

The capacitor presents high capacitance (typically lying in the range 300 nanofarads (nF) to 1.5 microfarads (µF)), such that the voltage across its terminals does not drop during implantation.

After the implantation stage, the switch SW is opened and the generator SOU charges the capacitor CDD once more.

During this time, the equivalent capacitance of the machine discharges totally into the plasma and the substrate returns to a floating potential. As a result, the electrons of the plasma neutralize the isolating zones of the substrate, which becomes positively charged during implantation.

The neutralization stage during which the switch SW remains open typically lasts for a duration in the range 1 µs to 80 µs.

Once the neutralization stage is over, the plasma may be extinguished during an extinction stage, which presents the advantage of reducing interactions between plasma and surface, of reducing the thermal budget, and of minimizing particle creation. This extinction stage typically has a duration of 20 µs to 200 µs, and during this stage the switch SW remains open.

It is then possible to repeat the above-described cycle:
  implantation stage;
  neutralization stage; and
  extinction stage.

Figure 6:
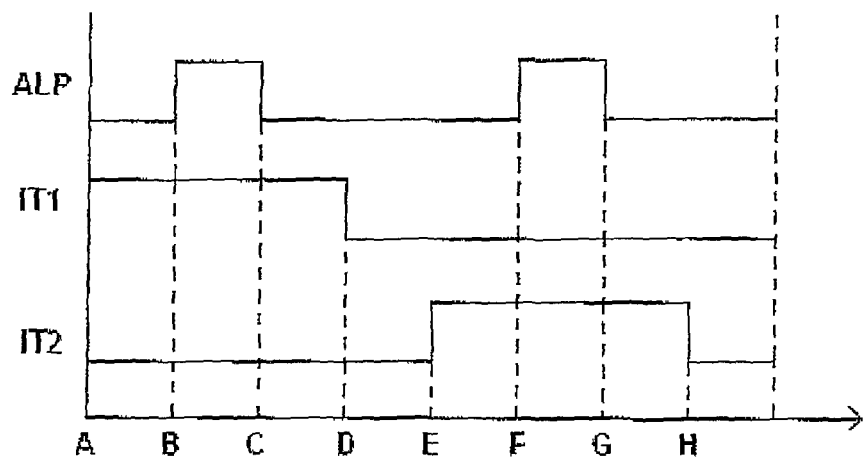
FIG. 6 is a timing chart showing an ion implantation method.

With reference to FIG. 6, in the third embodiment of the substrate power supply as described with reference to FIG. 5, the implantation method using the implanter takes place as follows.

Initial state:
  plasma power supply ALP inactivated;
  first switch IT1 open;
  second switch IT2 open.

The implantation stage takes place that the beginning of a cycle, beginning with an initialization step represented by point A in FIG. 6.

This initialization step begins by closing the first switch IT1. It extends over a stabilization period that typically lies in the range 1 µs to 5 µs.

After this initialization step, there comes an activation stage (point B in FIG. 6), during which stage the plasma power supply ALP is activated. The duration of this activation step typically lies in the range 5 µs to 100 µs.

There follows an extinction step (point C in FIG. 6), at the beginning of which the plasma power supply ALP is inactivated. This step during which the plasma is extinguished typically has a duration of 20 µs to 200 µs. It terminates the implantation stage.

A pause step (point D in FIG. 6) begins by opening the first switch IT1 and terminates at the beginning of the neutralization stage. It may be relatively short, since it needs to last only for as long as the first switch IT1 is not fully open and for as long as the plasma is not fully extinguished. Its duration is thus longer than 0.1 µs, and typically lies in the range 1 µs to 10 µs.

The neutralization stage begins with a preliminary step (point E in FIG. 6) at the beginning of which the second switch SW2 is closed. This preliminary step lasts for as long as the voltage of the substrate carrier platen has not returned to the voltage applied to the neutralization terminal N. Its duration typically lies in the range 1 µs to 40 µs.

There follows a zeroing step (point F in FIG. 6) during which the plasma power supply ALP is activated. Electrons in the plasma are attracted to those zones of the substrate that are positively charged and they serve to neutralize the charge. The duration of this zeroing step typically lies in the range 1 µs to 80 µs.

There follows an inactivation step (point G in FIG. 6) at the beginning of which the plasma power supply is deactivated. The duration of this step is typically a few tens of microseconds.

The cycle terminates with an interruption step (point H in FIG. 6) that begins with the second switch SW2 being opened. This interruption step lasts for as long as the second switch is not fully open and for as long as the plasma is not fully extinguished, in order to return to the initial state.

At which point a new cycle can be initiated.

It can thus be seen that the relaxation stage (between points C and F in FIG. 6) during which the plasma power supply ALP is inactivated overlaps the implantation stage and the initialization stage.

Figure 7:
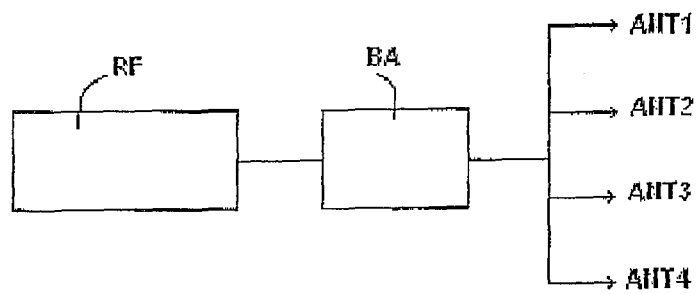
FIG. 7 shows a first embodiment of the source body power supply.

With reference to FIG. 7, there follows a description of a first embodiment of the plasma power supply ALP for the source bodies CS1, CS2, CS3, and CS4. A radiofrequency generator RF is followed by a tuning box BA that powers the four antennas ANT1, ANT2, ANT3, and ANT4. This embodiment has the advantages of simplicity and of being inexpensive. Nevertheless, it requires very good balancing of the plasma in each source body.

Figure 8:
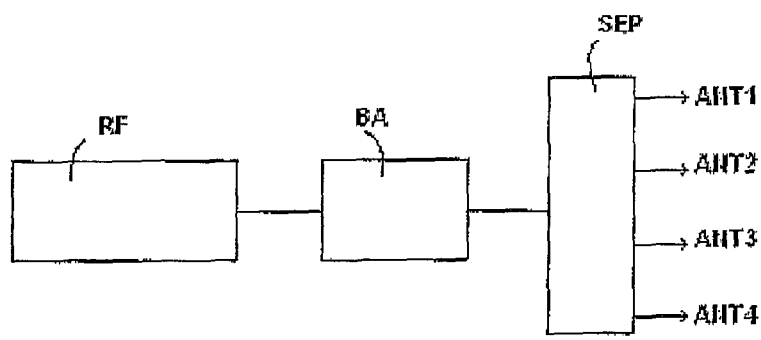
FIG. 8 shows a second embodiment of the source body power supply.

With reference to FIG. 8, in a second embodiment, this situation is improved. The radiofrequency generator RF is still followed by a tuning box BA, but it is now connected to a four-channel separator SEP having its channels connected to respective ones of the antennas ANT1, ANT2, ANT3, and ANT4. This makes it possible to share power in such a manner as to make it equal for each of the source bodies CS1, CS2, CS3, and CS4. Nevertheless, it can be found difficult to achieve tuning, in particular during stages of igniting the plasma.

Figure 9:
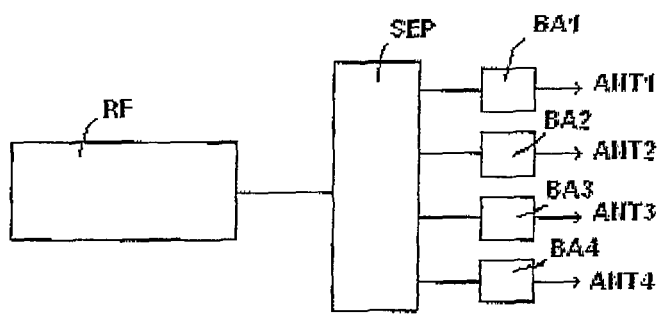
FIG. 9 shows a third embodiment of the source body power supply.

With reference to FIG. 9, in a third embodiment, this situation is improved. In this embodiment, the radiofrequency generator RF is followed by four-channel separator SEP. The first channel is connected to a first tuning box BA1 that powers the first antenna ANT1. The second channel is connected to a second tuning box BA2 that powers the second antenna ANT2. The third channel is connected to a third tuning box BA3 that powers the third antenna ANT3. Finally, the fourth channel is connected to a fourth tuning box BA4 that powers the fourth antenna ANT4.

Naturally, the best solution in terms of possible adjustments consists in providing a power supply and a tuning box for each source body CS1, CS2, CS3, and CS4, but such a solution is expensive and the equipment required is bulky. In addition, it then becomes necessary to synchronize the various power supplies.

The above-described embodiments of the invention are selected for their concrete nature. Nevertheless, it is not possible to identify exhaustively all embodiments covered by the invention. In particular, any means described may be replaced by equivalent means without going beyond the ambit of the present invention.

The invention claimed is:

1. An ion implanter for implanting ions in a substrate, said ion implanter comprising an enclosure having arranged therein a substrate carrier for carrying said substrate and connected to a substrate power supply via a high voltage electrical passage, the enclosure being provided with pump means, said enclosure (ENV) also having at least two cylindrical source bodies free from any obstacle and arranged facing said substrate carrier for simultaneous irradiation of said substrate; the ion implanter being characterized in that it includes at least one confinement coil per source body.

2. An ion implanter according to claim 1, characterized in that each of said source bodies is provided with an external radiofrequency antenna.

3. An ion implanter according to claim 1, characterized in that it includes a common radiofrequency generator for all of said antennas.

4. An ion implanter according to claim 3, characterized in that it includes a single tuning box arranged between said radiofrequency generator and said antennas.

5. An ion implanter according to claim 3, characterized in that it includes, downstream from said radiofrequency generator, a tuning box followed by a separator.

6. An ion implanter according to claim 3, characterized in that it includes, downstream from said radiofrequency generator, a separator followed by a number of tuning boxes identical to the number of source bodies.

7. An ion implanter according to claim 1, wherein said substrate carrier is configured to carry a substrate for ion implantation and said two source odies are arranged facing said substrate carrier for simultaneous irradiation of said substrate.

* * * * *